United States Patent
Thompson et al.

(10) Patent No.: US 11,152,533 B1
(45) Date of Patent: Oct. 19, 2021

(54) ETCHANT-ACCESSIBLE CARRIER SUBSTRATE FOR DISPLAY MANUFACTURE

(71) Applicant: Facebook Technologies, LLC, Menlo Park, CA (US)

(72) Inventors: Daniel Bryce Thompson, Cork (IE); Daniel Brodoceanu, Cork (IE); Pooya Saketi, Cork (IE)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 52 days.

(21) Appl. No.: 16/363,971

(22) Filed: Mar. 25, 2019

Related U.S. Application Data

(60) Provisional application No. 62/734,745, filed on Sep. 21, 2018.

(51) Int. Cl.
    *H01L 33/00* (2010.01)
    *H01L 25/075* (2006.01)

(52) U.S. Cl.
    CPC ...... *H01L 33/0095* (2013.01); *H01L 25/0753* (2013.01); *H01L 33/0066* (2013.01); *H01L 33/0093* (2020.05); *H01L 2933/0033* (2013.01)

(58) Field of Classification Search
    None
    See application file for complete search history.

(56) References Cited

U.S. PATENT DOCUMENTS

| | | | |
|---|---|---|---|
| 2007/0221944 A1* | 9/2007 | Cheol Yoo | H01L 33/387 257/99 |
| 2009/0110017 A1* | 4/2009 | Aihara | H01L 33/0093 372/44.01 |
| 2009/0173963 A1* | 7/2009 | Hsu | H01L 33/385 257/99 |
| 2014/0319557 A1* | 10/2014 | Cho | H01L 33/32 257/94 |
| 2015/0311383 A1* | 10/2015 | Sarkissian | H01L 33/08 257/13 |
| 2016/0300825 A1* | 10/2016 | Hoeppel | H01L 31/1876 |
| 2019/0165037 A1* | 5/2019 | Chae | H01L 25/13 |

* cited by examiner

*Primary Examiner* — Nilufa Rahim
(74) *Attorney, Agent, or Firm* — Weaver Austin Villeneuve & Sampson LLP

(57) ABSTRACT

Techniques are disclosed for utilizing an etchant-accessible carrier substrate that enables etching through the carrier substrate. More particularly, an etchant is provided access to the adhesive layer via the etchant-accessible carrier substrate via one or more holes in the etchant-accessible carrier substrate. The size and/or pattern of the holes may vary, depending on desired functionality. The etching process may be optionally stopped prior to the removal of all of the adhesive layer such that at least a portion of the adhesive layer remains, which can help ensure the light-emitting structures do not slip off of the etchant-accessible carrier substrate as the etchant-accessible carrier substrate is moved from one location to another during the fabrication process.

23 Claims, 15 Drawing Sheets

ETCHANT-ACCESSIBLE CARRIER SUBSTRATE FOR DISPLAY MANUFACTURE

RELATED APPLICATIONS

This application claims the benefit of U.S. Provisional Application No. 62/734,745, filed Sep. 21, 2018, entitled "ETCHANT-ACCESSIBLE CARRIER SUBSTRATE FOR DISPLAY MANUFACTURE," which is assigned to the assignee hereof, and incorporated by reference herein in its entirety.

BACKGROUND

Modern electronics, such as virtual reality (VR), augmented reality (AR), and/or mixed reality (MR) devices, may include displays with very small light-emitting diodes (LEDs), such as micro-LEDs (μLED). According to some techniques, the manufacture of these displays may involve temporarily coupling light-emitting structures (comprising one or more LEDs) to a carrier substrate using an adhesive layer, removing a fabrication substrate attached to the light-emitting structures, then etching the adhesive layer to enable the light-emitting structures to be decoupled from the carrier substrate.

But issues can arise in the etching of the adhesive layer. For example, the proximity of adjacent light-emitting structures can restrict the etchant's access to the adhesive layer, which can slow down the etching process and make it become a bottleneck in the manufacturing process. The width of the light-emitting structures may also prevent the etchant from removing enough of the adhesive layer to ensure the proper decoupling of the light-emitting structures from the carrier substrate.

SUMMARY

Embodiments address these and other issues by utilizing an etchant-accessible carrier substrate that enables etching through the carrier substrate. More particularly, an etchant is provided access to the adhesive layer via the etchant-accessible carrier substrate via one or more holes in the etchant-accessible carrier substrate. The size and/or pattern of the holes may vary, depending on desired functionality. The etching process may be optionally stopped prior to the removal of all of the adhesive layer such that at least a portion of the adhesive layer remains, which can help ensure the light-emitting structures do not slip off of the etchant-accessible carrier substrate as the etchant-accessible carrier substrate is moved from one location to another during the fabrication process.

An example method of manufacturing light-emitting structures, according to the description, comprises coupling a semiconductor assembly with a carrier substrate using an adhesive layer. The semiconductor assembly comprises one or more light-emitting structures physically attached to a fabrication substrate. The method further comprises removing the fabrication substrate from the one or more light-emitting structures such that the one or more light-emitting structures remain coupled with the carrier substrate via the adhesive layer. The method also comprises etching the adhesive layer such that an etchant is able to access the adhesive layer via one or more holes in the carrier substrate, and decoupling the one or more light-emitting structures from the carrier substrate.

Another example method of manufacturing light-emitting structures, according to the description, comprises depositing an adhesive layer onto a first surface of a carrier substrate, where the first surface of the carrier substrate comprises one or more holes extending from the first surface to a second surface opposite the first surface. The method further comprises coupling a semiconductor assembly with the carrier substrate using an adhesive layer, where the semiconductor assembly comprises one or more light-emitting structures physically attached to a fabrication substrate, and coupling the semiconductor assembly with a carrier substrate comprises applying a force to the semiconductor assembly, the carrier substrate, or both, to cause at least a portion of the one or more light-emitting structures to enter into the adhesive layer. The method also comprises removing the fabrication substrate from the one or more light-emitting structures such that the one or more light-emitting structures remain coupled with the carrier substrate via the adhesive layer, and etching the adhesive layer such that an etchant is able to access the adhesive layer via the one or more holes in the carrier substrate.

An example non-transitory, computer-readable medium, according to the disclosure, has instructions embedded thereon for manufacturing light-emitting structures. The instructions, when executed by one or more assembly devices, cause the one or more assembly devices to couple a semiconductor assembly with a carrier substrate using an adhesive layer, the semiconductor assembly comprising one or more light-emitting structures physically attached to a fabrication substrate, remove the fabrication substrate from the one or more light-emitting structures such that the one or more light-emitting structures remain coupled with the carrier substrate via the adhesive layer, etch the adhesive layer such that an etchant is able to access the adhesive layer via one or more holes in the carrier substrate, and decouple the one or more light-emitting structures from the carrier substrate.

An example assembly system for of manufacturing light-emitting structures, according to the disclosure, comprises a memory and a processor communicatively coupled with the memory. The processor is configured to couple a semiconductor assembly with a carrier substrate using an adhesive layer, where the semiconductor assembly comprises one or more light-emitting structures physically attached to a fabrication substrate, remove the fabrication substrate from the one or more light-emitting structures such that the one or more light-emitting structures remain coupled with the carrier substrate via the adhesive layer, etch the adhesive layer such that an etchant is able to access the adhesive layer via one or more holes in the carrier substrate, and decouple the one or more light-emitting structures from the carrier substrate.

BRIEF DESCRIPTION OF THE DRAWINGS

Illustrative embodiments are described with reference to the following figures.

The figures depict embodiments of the present disclosure for purposes of illustration only. One skilled in the art will readily recognize from the following description that alternative embodiments of the structures and methods illustrated may be employed without departing from the principles of, or benefits touted in, this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label. Additionally, where a figure may illustrate multiple components and/or features of the same type, only a portion of the components and/or features may be labeled in some instances, to avoid clutter in the figure.

DETAILED DESCRIPTION

Several illustrative embodiments will now be described with respect to the accompanying drawings, which form a part hereof. While particular embodiments, in which one or more aspects of the disclosure may be implemented, are described below, other embodiments may be used and various modifications may be made without departing from the scope of the disclosure or the spirit of the appended claims.

Embodiments are described herein with reference to the figures, where like reference numbers indicate identical or functionally similar elements. Also in the figures, the left most digit of each reference number corresponds to the figure in which the reference number is first used.

Figure 2B:
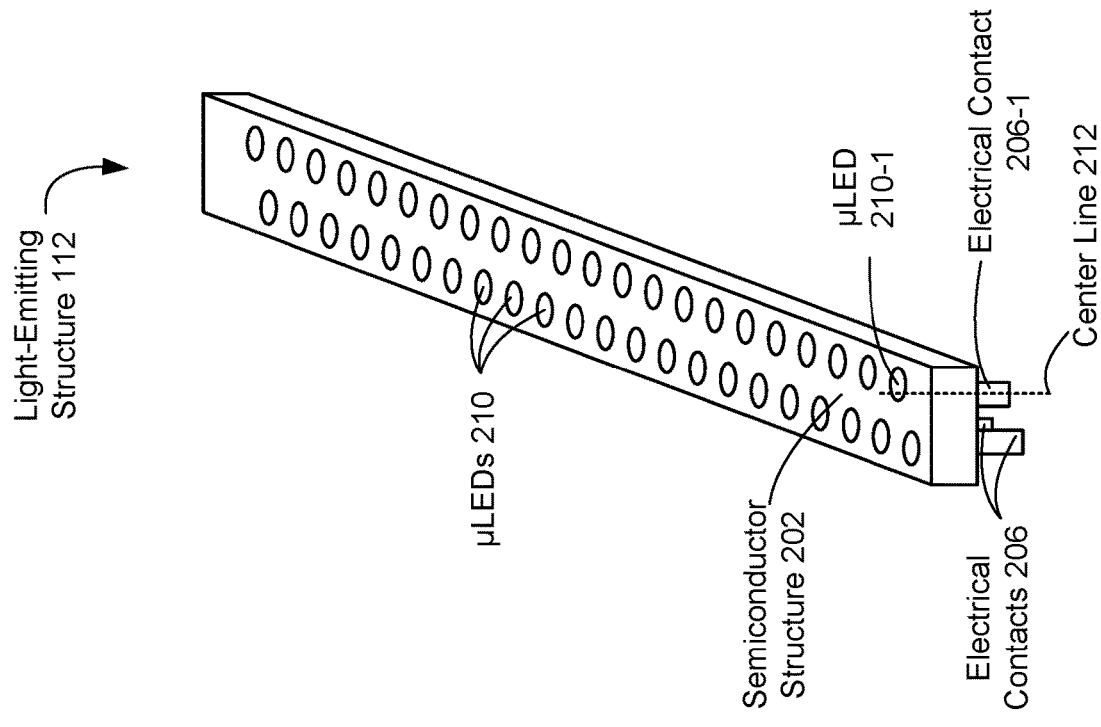
FIG. 2B is a perspective view of a light-emitting structure, according to an embodiment.

As used herein, a micro-LED (or "µLED") may refer to an LED that has an active light-emitting area with a linear dimension that is less than 50 µm, less than 20 µm, or less than 10 µm. For example, the linear dimension may be as small as 2 µm or 4 µm. As shown in FIG. 2B and described herein, light-emitting structures may comprise multiple µLEDs.

Figure 1:
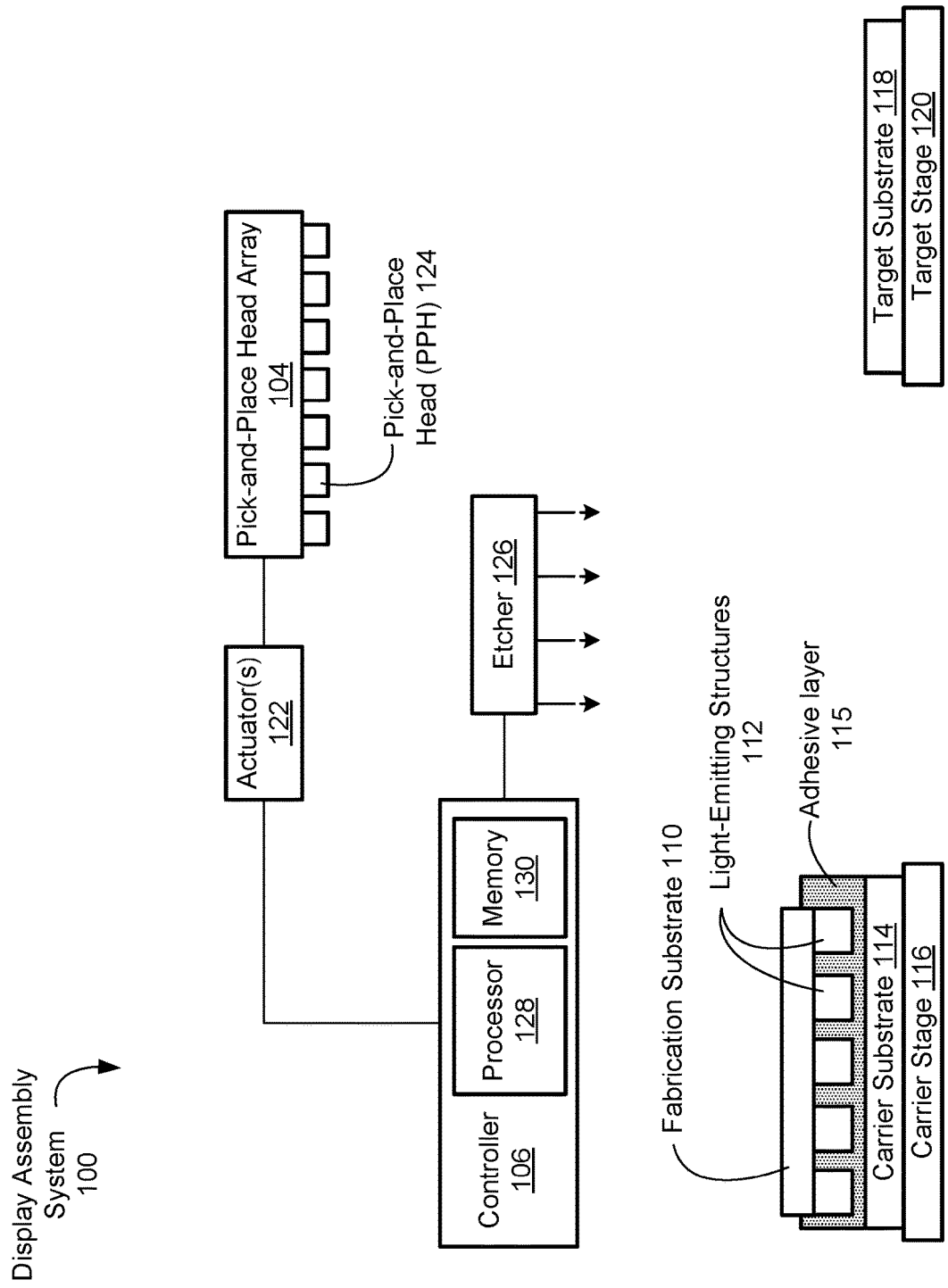
FIG. 1 is a simplified illustration of a display assembly system 100, according to an embodiment.

FIG. 1 is a simplified illustration of a display assembly system 100, according to one embodiment. The display assembly system 100 fabricates a display device through a pick-and-place technique. Specifically, the display assembly system 100 assembles a display by picking up light-emitting structures, which may comprise micro-LEDs (µLEDs), from a carrier substrate 114, and places them onto a target substrate 118. In some embodiments, the light-emitting structures 112 are LED dies that emit different color. In some embodiments, the light-emitting structures 112 are different color µLEDs having a reduced divergence of light output and a small light-emitting area. The carrier substrate 114, which also may be referred to as a "hard handle," described in more detail herein below, may comprise a glass substrate or similar structure that holds the light-emitting structures 112 for pick up by the pick-and-place array 104. The pick-and-place array 104, or pick-up head, may be referred to as a pick and place head (PPH) array. In other embodiments, the carrier substrate 114 may comprise the native substrate on which the light-emitting structures 112 are grown. Alternatively, as discussed in further detail below, the light-emitting structures 112 may be grown on a fabrication substrate and attached to the carrier substrate 114 via an adhesive layer 115, in which case the fabrication substrate 110 may be removed and the adhesive layer 115 may be (completely or partially) removed to enable extraction of the light-emitting structures 112 from the carrier substrate 114. Additional details are described below in relation to FIGS. 3A-5C.

The target substrate 118 may be a display substrate, or may be an intermediate carrier substrate that facilitates bonding with a display substrate. The display assembly system 100 places light-emitting structures 112 at locations of the display substrate, and then bonds the light-emitting structures 112 to the display substrate.

As shown, the display assembly system 100 further includes a pick-and-place array 104, an actuator 122, a carrier stage 116, and a target stage 120. The carrier stage 116 holds a carrier substrate 114 having one or more light-emitting structures 112. The target stage 120 holds a target substrate 118 to receive some or all of the light-emitting structures 112 from the carrier substrate 114.

A controller 106 may be communicatively coupled with the pick-and-place array 104 (e.g., via the actuator 122) and controls the operations of the pick-and-place array 104. For example, the controller 106 causes the pick-and-place array 104 to pick up one or more light-emitting structures 112 located on a carrier substrate 114, and place the one or more semiconductor devices on the target substrate 118. The controller 106 may include, among other components, a memory 130 and a processor 128. The memory 130 stores instructions for operating the pick-and-place array 104. The memory 130 may be any memory storage, such as an SRAM, DRAM, ROM, or any other computer memory storage. The processor 128 executes the instructions stored in the memory 130 and sends out the instructions to the pick-and-place array 104 via a signal interface (not shown). The processor 128 may cause the display assembly system 100 to perform the methods described in further detail with reference to FIGS. 13 and 14.

The pick-and-place array 104 includes a plurality of pick-up heads 124. Each pick-up head 124 can pick up a light-emitting structure 112 from the carrier substrate 114, and place the semiconductor device on the target substrate 118. After picking up a light-emitting structure 112, the pick-up head 124 may be aligned with a location on the target substrate 118.

The actuator 122 may comprise an electro-mechanical component that controls the movement of the pick-and-place array 104 based on instructions from the controller 106, as executed by the processor 128 from instructions stored in memory 130, and thus controls the transfer of the light-emitting structure 112 from carrier substrate 114 and placement on the target substrate 118. For example, the actuator 122 may move the pick-and-place array 104, or individual pick-up heads 124, with three degrees of freedom including up and down, left and right, and forward and back. In some embodiments, the pick-and-place array 104 has more than three degrees of freedom. For example, the pick-and-place array 104 may have six degrees of freedom, allowing for lateral motion up and down, left and right, and forward and back, as well as rotational motion along three different axes. The actuator 122 may be embodied, for example, as a rotating motor, a linear motor, or a hydraulic cylinder.

The controller 106 may align the one or more pick-and-place heads 124 with the target substrate 118, and places the light-emitting structures 112 attached to the one or more pick-and-place heads 124 on the target substrate 118.

The display assembly system 100 may include one or more carrier substrates 114. For example, different carrier substrates 114 may carry different color LED dies. A carrier substrate 114 may be carrier film that holds singulated light-emitting structures 112 for transfer to the target substrate 118. The system may include one or more target substrates 118. In some embodiments, such as when the target substrate 118 comprises the display substrate for receiving the light-emitting structures 112, the target stage 120 may include a heater for thermal conductive bonding of the electrical contact pads of the light-emitting structures 112 to the target substrate 118 subsequent to placement of the light-emitting structures 112 on the target substrate 118 by the pick-and-place array 104. In other embodiments, the display assembly system 100 may include a laser system for laser bonding of the electrical contact pads of the light-emitting structures 112 to the target substrate 118 subsequent to placement of the light-emitting structures 112 on the target substrate 118 by the pick-and-place array 104.

In some embodiments, the display assembly system 100 may comprise multiple pick-up head arrays 104 each positioned at a separate station. Each station may be dedicated to the pick-and-place array of a particular color LED, such as a green station for green LEDs, a red station for red LEDs, and a blue station for blue LEDs, etc. Different colored LEDs are grown on different native substrates, which may be different carrier substrates 114 as shown in FIG. 1, due to differences in their composition and structure.

In embodiments in which the light-emitting structures 112 comprise µLEDs, creating enough Van der Waals force between the pick-up surface of the light-emitting structures 112 and the pick-and-place head 124 is important, since the small surface of the µLEDs reduces the surface area over which the Van der Waals interactions can occur. Furthermore, during movement of the carrier substrate 114 (e.g., to move the light-emitting structures 112 to another tool, which may occur during the course of display manufacture), the light-emitting structures 112 are ideally secured, so that when the pick-and-place head 124 comes into contact with the pick-up surface of the light-emitting structures 112, the two surfaces align and there is minimal tilting of the light-emitting structures 112. Using an adhesive layer 115 on the carrier substrate 114 as described in FIGS. 3A-5C, the pick-and-place technique of the display assembly system 100 can be used to successfully place light-emitting structures 112 from the carrier substrate 114 to the target substrate 118.

In some embodiments, the force between the pick-up surface of the light-emitting structures 112 and the pick-and-place head 124 may be any adhesion force in addition to or other than a Van der Waals force. For example, the pick-and-place head 124 may include grippers that grip the light-emitting structures 112 and remove them from the carrier substrate 114. In other examples, the pick-and-place head 124 may pick up light-emitting structures 112 using electrostatic forces.

The display assembly system 100 includes an etcher 126. The etcher 126 etches the adhesive layer 115 of the light-emitting structure 112 on the carrier substrate 114 based on instructions received from the controller 106. The adhesive layer 115 is described in further detail with reference to FIGS. 3A-5C. The etcher 126 can etch the adhesive layer 115 without substantially affecting the light-emitting structure 112. The etcher 126 may comprise, for example, an oxygen dry-etcher, such as a Radio Frequency (RF) oxygen plasma reactor. In other embodiments, the etcher 126 may dry-etch an adhesive layer 115 with any gas that selectively removes the adhesive layer 115 without affecting the structure of the light-emitting structure 112. For example, the etcher 126 may use air plasma or ammonia (NH3), chlorine, boron, or fluorocarbon gas or any other gas capable of removing an adhesive layer 115. The etcher 126 may include gas intake and gas outtake valves, ionizing plates, and any other standard etching components.

Figure 2A:
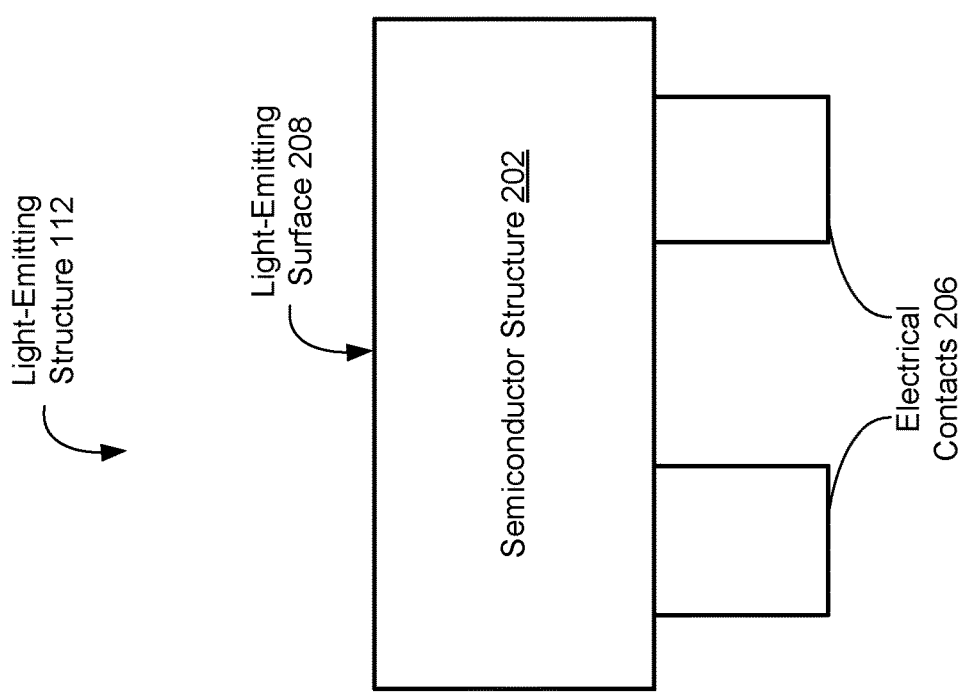
FIG. 2A is a cross-sectional view of a schematic diagram of a light-emitting structure, according to an embodiment.

FIG. 2A is a cross-sectional view of a schematic diagram of a light-emitting structure 112, which may comprise a µLED die, in accordance with one embodiment. The light-emitting structure 112 may include, among others, an semiconductor structure 202, and electrical contacts 206. The semiconductor structure 202 may, in some embodiments, comprise semiconducting material made by epitaxial growth (epitaxy), such as gallium nitride (GaN), gallium arsenide (GaAs), or the like. The electrical contacts 206 serve as interconnects for the light-emitting structure 112 when the light-emitting structure 112 is mounted to a display substrate.

The electrical contacts 206 may be provided in the form of bumps or microbumps, for interconnection of the light-emitting structure 112 to an electrical conductor. The electrical contacts may be arranged on a surface of the light-emitting structure 112 and may be formed on top of the p- and n-contacts of an LED in the semiconductor structure 202, which may be arranged on a single side of the semiconductor structure 202 opposite to the light-emitting surface 208. The electrical contacts 206 may be made of a metal (e.g., copper (Cu), tin (Sn), and/or other metals) to interconnect to metal pads (e.g., Cu pads) on electrical conductors on a display substrate. In some embodiments, a single electrical contact 206 for an LED (e.g., the anode) may be located near the LED (e.g., on a surface opposite the light-emitting surface of the LED), and the other electrical contact 206 (e.g., the cathode) may be electrically connected with other LEDs in the light-emitting structure, forming a common electrical contact 206, which may be located elsewhere (e.g., at an end of the light-emitting structure 112).

FIG. 2B is a perspective view of a light-emitting structure 112, according to an embodiment. Here, the light-emitting structure 112 comprises a die having two rows of offset μLEDs 210 (which effectively may comprise a single output row in the resulting display, depending on desired functionality). That is, rows may be offset to provide a more compact horizontal (or vertical) output pitch in the resulting display. Additionally, as illustrated in FIG. 2B, electrical contacts 206 may be slightly offset from corresponding μLEDs 210. That is, depending on manufacturing and/or other concerns, the center of an electrical contact 206-1 may not align with the center of a corresponding μLED 210-1 to which the electrical contact 206-1 is electrically connected, as illustrated by the center line 212.

It can be noted that, alternative embodiments may vary from the embodiment illustrated in FIG. 2B. For example, μLEDs 210 (or other light-emitters) may be arranged differently on the light-emitting structure 112, the light-emitting structure 112 may have a different shape, there may be more or fewer rows (including only a single row) of μLEDs 210, μLEDs 210 may have two contacts each (e.g., rather than sharing a common electrical contact among multiple μLEDs 210) and/or there may be more or fewer μLEDs 210 (including only a single μLED 210), etc. A person of ordinary skill in the art will appreciate other such variations.

It can be noted that FIGS. 2A and 2B are simplified drawings provided for illustrative purposes. Embodiments of a light-emitting structure 112 may comprise additional features not explicitly shown in FIGS. 2A and 2B, or other figures herein. For example, embodiments may include one or more mesas, which may help direct light generated by the light-emitting structure 112. In some embodiments, a mesa may be located on a surface opposite the light-emitting surface 208. In such embodiments, and electrical contact 206 may be located on or near the mesa.

Figure 3A:
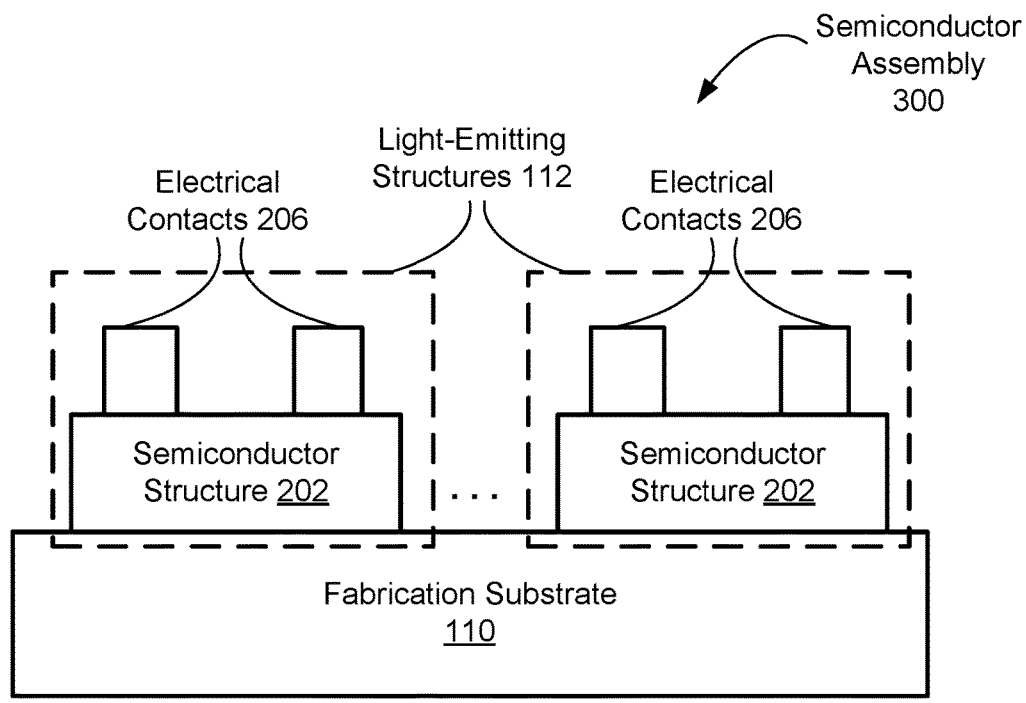
FIGS. 3A-3C are cross-sectional diagrams illustrating different stages of a process of manufacturing a display device.
Figure 3B:
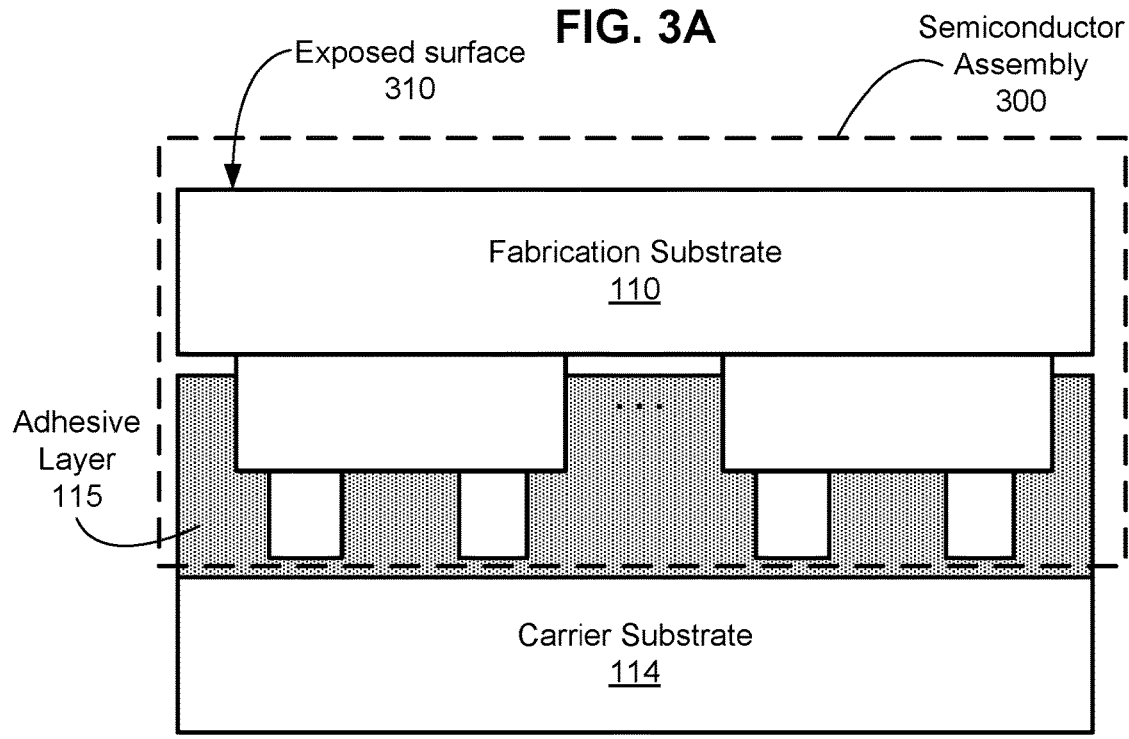
Figure 3C:
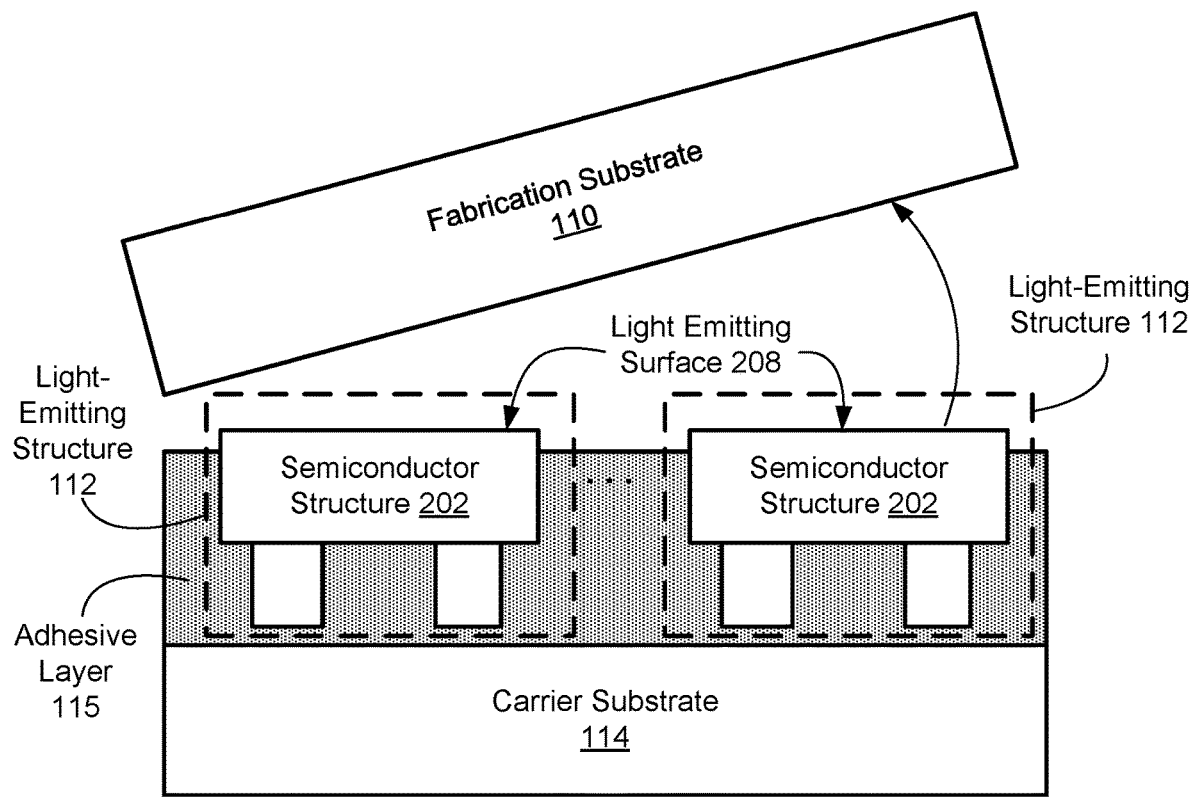

FIGS. 3A-3C are diagrams illustrating different stages of a process of manufacturing a display device, according to one embodiment. FIG. 3A illustrates a semiconductor assembly 300 comprising an array of light-emitting structures 112 fabricated on a fabrication substrate 110. As illustrated in FIGS. 2A and 2B, each light-emitting structure 112 includes an semiconductor structure 202 and electrical contacts 206.

The semiconductor assembly 300 may be made using a number of semiconductor fabrication processes, which may vary depending on desired functionality, materials used, and/or other factors. According to some embodiments, the process of creating the semiconductor assembly 300 generally may include forming, for each light-emitting structure 112, the semiconductor structure 202 on the fabrication substrate 110 (e.g., through epitaxial growth), utilizing various doping and/or similar techniques to ensure formation of one or more LEDs, then forming the corresponding electrical contacts 206 on each semiconductor structure 202. As noted by the ellipsis shown in FIGS. 3A-3C, any number of light-emitting structures 112 may be formed on the fabrication substrate 110 (including a single light-emitting structure 112, in some embodiments).

The fabrication substrate 110 may comprise a material with a crystalline structure that may facilitate epitaxial growth of the semiconductor structures 202. As such, the composition of the fabrication substrate may depend on the type of semiconductor material desired for the semiconductor structures 202. In some embodiments, for example, the fabrication substrate 110 may comprise sapphire.

FIG. 3B illustrates the next step in the manufacturing process in which the semiconductor assembly 300 is flipped over (relative to what is shown in FIG. 3A), and coupled with on the carrier substrate 114, or "hard handle," according to an embodiment. As described in relation to FIG. 1, the semiconductor assembly 300 is coupled to the carrier substrate 114 using an adhesive layer 115. In some embodiments, the adhesive layer 115 may be deposited or otherwise coupled to the carrier substrate 114, and a force may be applied to the semiconductor assembly 300, the carrier substrate 114, or both, to press the semiconductor assembly 300 at least partially into the adhesive layer 115. In some embodiments, the adhesive layer 115 may comprise a polymer (e.g., a single or bi-layer polymer).

It can be noted that although embodiments illustrated herein show a portion of the adhesive layer 115 between the electrical contacts 206 of the semiconductor assembly 300 and the carrier substrate 114, the electrical contacts 206 and the carrier substrate 114 may come in contact in some instances. This may depend on the amount of pressure applied, viscosity of the adhesive layer 115 and/or other factors. Benefits of the embodiments of an etchant-accessible carrier substrate as described herein below apply equally in such instances.

FIG. 3C illustrates removing the fabrication substrate 110 to singulate the light-emitting structures 112. In some embodiments, the fabrication substrate 110 can be removed from the light-emitting structures 112, for example, by applying a "laser lift off" (LLO) process. In an LLO process, which may be performed in embodiments in which the semiconductor structures 202 comprise GaN (for example), a laser may be used to illuminate an interface between the fabrication substrate 110 and the light-emitting structures 112, which may cause the nitrogen (N) to separate from the gallium (Ga), exit the interface, and leave a residual layer of Ga at the interface. The entire assembly may then be heated up to the melting point of Ga, enabling the fabrication substrate 110 to be removed from the liquefied layer of Ga. The remaining Ga may then be removed (e.g., by 1.8%-5% HCl) to expose light-emitting surfaces 208 of the semiconductor structures 202 (and remove any potential distortions that any remaining Ga may otherwise cause). As a person of ordinary skill in the art will appreciate, other materials may utilize other processes to remove the fabrication substrate 110. (In embodiments in which the semiconductor structures 202 comprise GaAs, for example, the fabrication substrate 110 may be removed using a simple wet etching process.)

In some embodiments, an elastomer layer (not shown) is deposited or formed on the light-emitting surface 208. The elastomer layer can facilitate the attachment of light-emitting structures 112 to a PPH (e.g., pick-and-place array 104 of FIG. 1) for placement on a target substrate during display manufacture.

The above-described process of placing semiconductor assembly 300 on a carrier substrate 114, and removing the fabrication substrate 110 can be repeated for light-emitting structures 112 that emit different colored light (for embodiments in which μLEDs of a single light-emitting structure 112 emit a single color of light). In this manner, light-emitting structures 112 may be placed in a display to form a polychromatic pixel assembly that includes μLEDs that emit red, green, and blue light.

As previously noted, the process of decoupling the singulated light-emitting structures 112 from the carrier substrate 114 can pose a bottleneck in the manufacturing process. In some processes conducted by the inventors, for example, the etching may take roughly five hours to complete. Because the light-emitting structures 112 are at least partially disposed within the adhesive layer 115, the force of adhesion provided by the adhesive layer 115 may prevent a pick-up head array (e.g., pick-and-place array 104 of FIG. 1) 104 from extracting light-emitting structures 112 from the adhesive layer 115. To reduce this adhesive force, the adhesive layer 115 can be at least partially removed by etching. However, the etching process can take a long time due to the limited access an etchant (e.g., a plasma) has to the adhesive layer 115.

Figure 4:
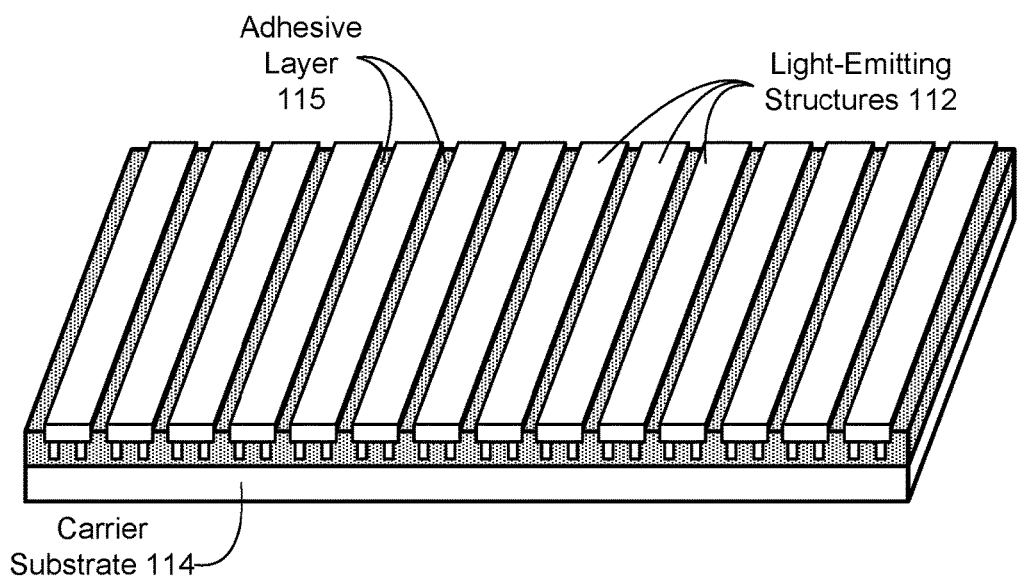
FIG. 4 is a perspective view of light-emitting structures, an adhesive layer, and a carrier substrate (e.g., the structures illustrated in FIG. 3C) after removal of the fabrication substrate.

FIG. 4 is a perspective view of the light-emitting structures 112, adhesive layer 115, and carrier substrate 114 (e.g., the structures illustrated in FIG. 3C) after removal of the fabrication substrate 110, according to an embodiment. As can be seen, due to the close proximity of the light-emitting structures 112 (which may be intentionally fabricated at close proximity to increase yield), an etchant etching the adhesive layer 115 would have limited access to the adhesive layer 115, and thus, the etching process (e.g., as described previously in relation to FIG. 1) may take a relatively long time.

Figure 5A:
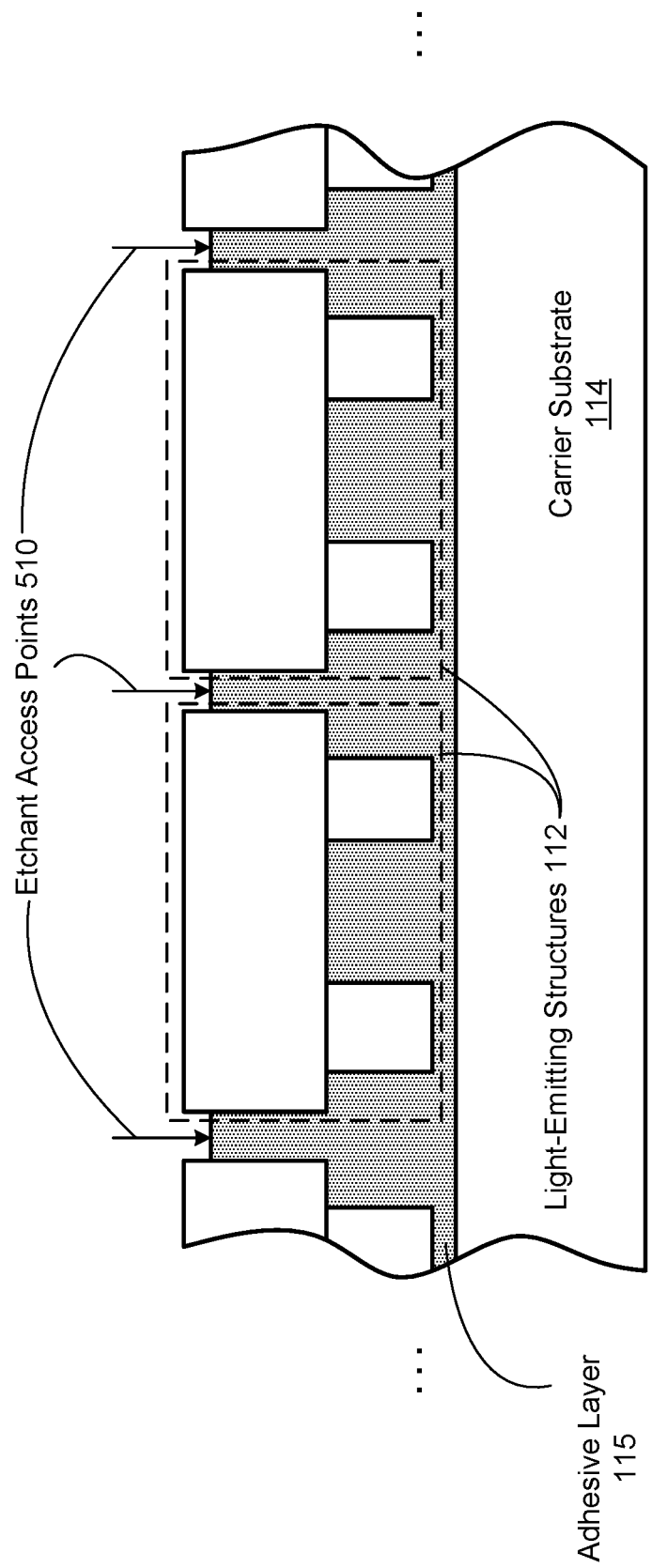
FIGS. 5A-5C are cross-sectional views of light-emitting structures, an adhesive layer, and a carrier substrate.
Figure 5B:
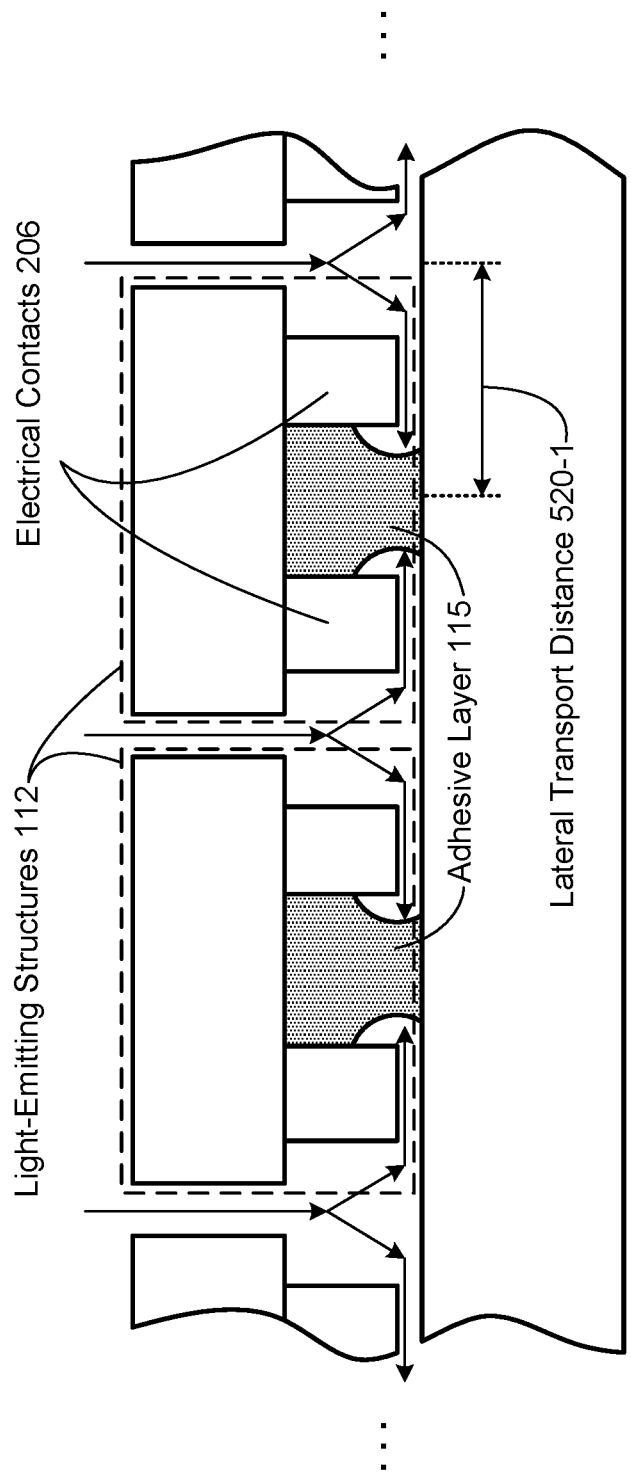
Figure 5C:
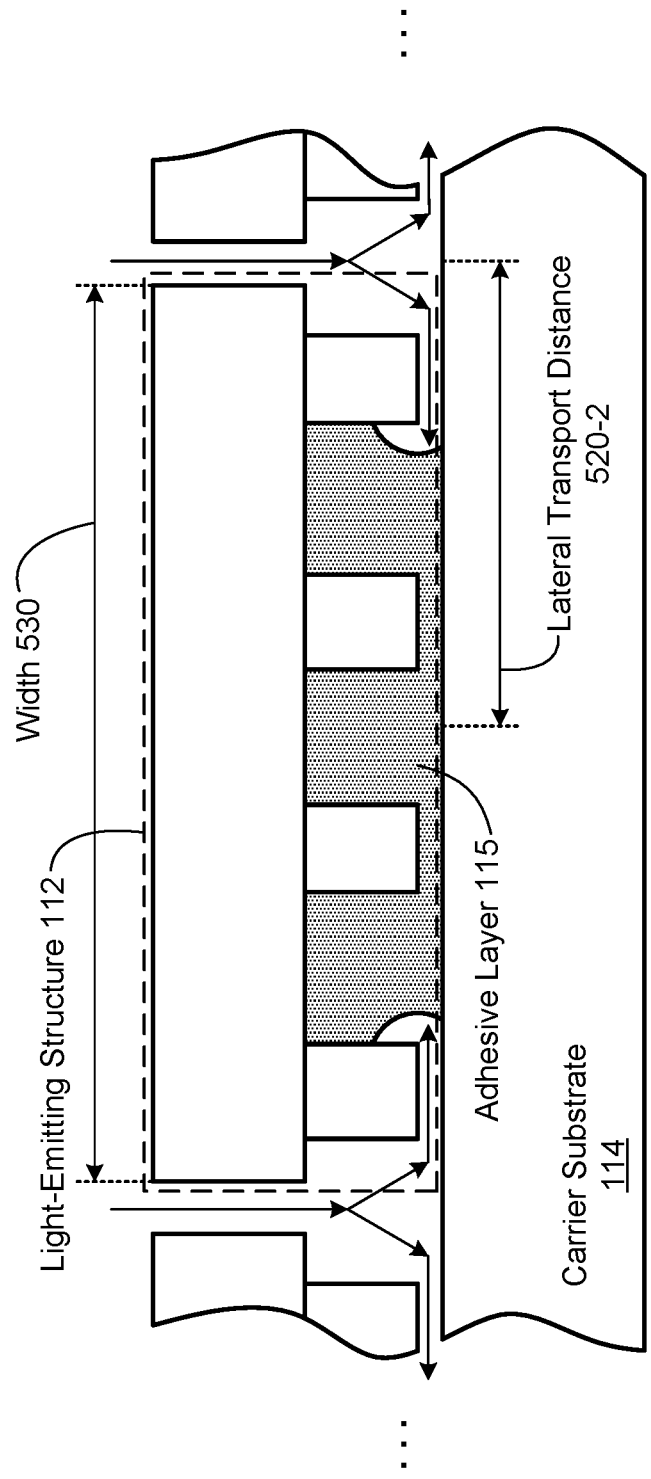

FIGS. 5A-5C are cross-sectional views of light-emitting structures 112, adhesive layer 115, and carrier substrate 114 that further illustrate this problem. FIG. 5A is a cross-sectional view illustrating the beginning of an etching process. Here, the etchant has limited access to the adhesive layer 115, as illustrated by the etchant access points 510.

FIG. 5B is a cross-sectional view illustrating the etching process sometime after etching has begun. Here, the etchant may generally travel along the path illustrated by the arrows in FIG. 5B. As can be seen, in this embodiment, the portions of the adhesive layer 115 between the electrical contacts 206 may be relatively difficult for the etchant to access and may therefore be the last portions of the adhesive layer to be etched. As illustrated, the etching process may be isotropic, although some embodiments additionally or alternatively may utilize anisotropic etching.

In the embodiment illustrated in FIG. 5B, the largest lateral distance an etchant would have to travel to remove the entire adhesive layer 115 is illustrated by lateral transport distance 520-1. As can be seen, the lateral transport distance 520-1 is a function of the dimensions (e.g., width) of the light-emitting structures 112. Moreover, depending on the etchant, the composition of the adhesive layer 115, and other factors, the etchant may have a maximum lateral transport distance with which the etchant is capable of etching the adhesive layer 115. For relatively small light-emitting structures 112, this may not be a problem because the maximum lateral transport distance may exceed the lateral transport distance 520-1. For larger light-emitting structures 112, however, this may present an additional problem during etching.

FIG. 5C is a cross-sectional view of an embodiment in the width 530 of the light-emitting structure 112 that is much larger than in the embodiments illustrated in FIGS. 5A and 5B. As such the lateral transport distance 520-2 for the etchant is also larger. As such, etching may take far longer than in other embodiments, and slow down the manufacturing process even more. Moreover, in some instances the lateral transport distance 520-2 may actually exceed the maximum lateral transport distance the etchant is capable of etching the adhesive layer 115, in which case etching reaches a point of saturation in which it is simply incapable of removing enough of the adhesive layer 115 to enable decoupling of the light-emitting structure 112 from the carrier substrate 114. For example, in processes where the maximum lateral transport distance the etchant is capable of etching is 35 µm, light-emitting structures 112 having a width 530 or greater than 70 µm will always have a residual portion of the adhesive layer 115. Additionally, this may prevent the decoupling of the light-emitting structures 112 from being decoupled from the carrier substrate 114.

Figure 6A:
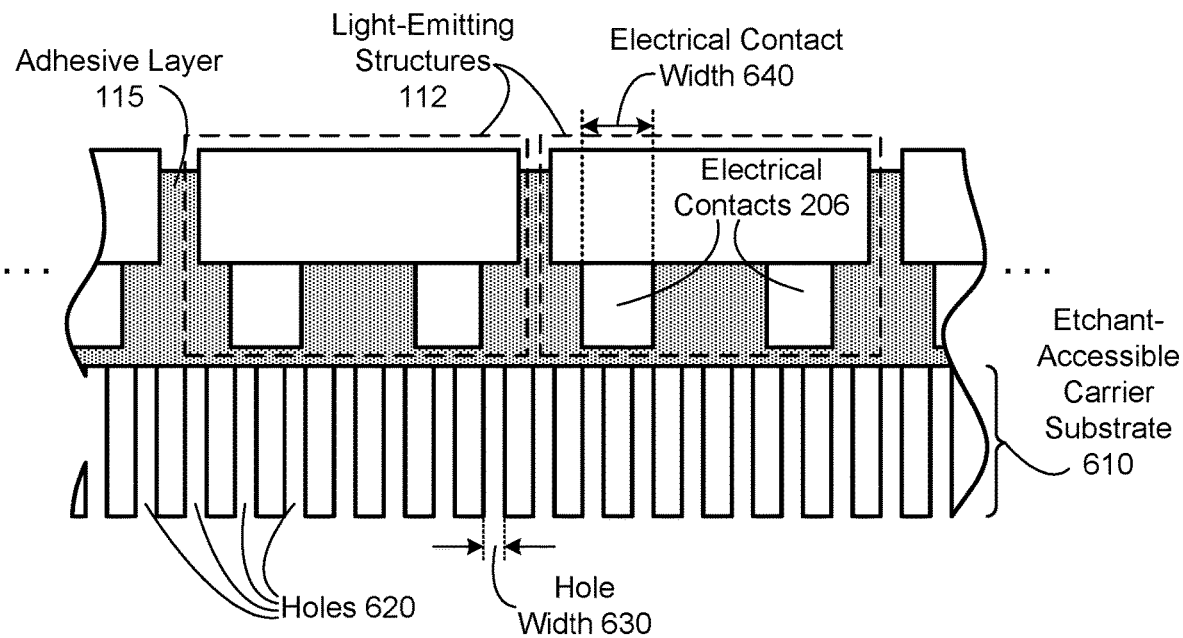
FIGS. 6A and 6B are cross-sectional views illustrating an etchant-accessible carrier substrate, according to an embodiment.
Figure 6B:
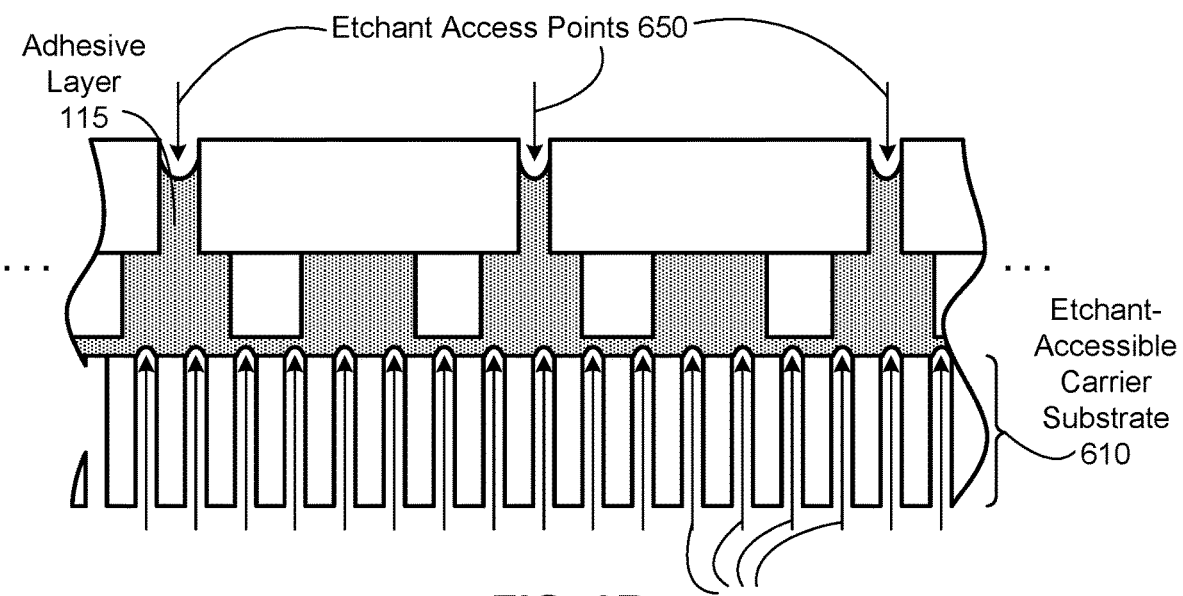

FIGS. 6A and 6B are cross-sectional views illustrating an embodiment that presents a solution to these and other issues that arise during etching. Similar to FIG. 5A, FIG. 6A is a cross-sectional view of light-emitting structures 112, and adhesive layer 115. Here, however, an etchant-accessible carrier substrate 610 is used. According to embodiments, an etchant-accessible carrier substrate 610 generally may include one or more holes 620 to allow an etchant to access the adhesive layer 115 from underneath, through the etchant-accessible carrier substrate 610. As such, embodiments may speed up the etching process and/or enable the etchant access to portions of the adhesive layer 115 otherwise inaccessible to the etchant.

In embodiments, such as the embodiment illustrated in FIGS. 6A and 6B, where the etchant-accessible carrier substrate 610 comprises a plurality of holes 620, a hole width 630 (e.g., hole diameter, in the case of cylindrical holes) may be smaller than an electrical contact width 640. This can help ensure the electrical contacts 206 do not get lodged in a hole 620 (in which case dislodging the electrical contacts 206 may be difficult). In some embodiments, for example, the electrical contacts are a cylindrical shape having a diameter of 3 to 6 µm. In such embodiments, an etchant-accessible carrier substrate 610 having holes with a hole width 630 of less than 3 µm may be used. Additionally or alternatively, an etchant-accessible carrier substrate 610 having holes 620 with a larger hole width 630 may be used, where holes 620 are patterned, aligned, and/or shaped to help ensure electrical contacts do not get lodged into the holes 620.

Many characteristics of the holes 620 may vary, depending on desired functionality. For instance, although holes 620 are illustrated in FIG. 6A as having a special periodicity (at least in one dimension), alternative embodiments may include a random pattern of holes 620 along one or more dimensions. Additionally or alternatively, holes 620 may be non-uniform in width. Additionally or alternatively, because light-emitting structures 112 may be considerably longer than they are wide (as illustrated in FIG. 4, for example), the holes 620 similarly may be longer than they are wide, stretching (for example) along a length of the light-emitting structures 112. A person of ordinary skill in the art will appreciate other such variations on hole characteristics (including the variation illustrated in FIG. 12). In some embodiments, holes 620 may be located and/or patterned in the etchant-accessible carrier substrate 610 such that light-emitting structures 112 have the same number of holes underneath them (and, optionally may be located at similar locations respective to the light-emitting structures 112), which may help ensure uniformity in the etching of the adhesive layer 115 between the light-emitting structure 112 and the etchant-accessible carrier substrate 610 for all light-emitting structures 112.

In some embodiments, holes may be formed in etchant-accessible carrier substrate 610 using a laser etching process. For example, laser drilling may be used to create the holes 620 into the etchant-accessible carrier substrate 610. According to some embodiments, laser drilling can work in two steps: first the material (e.g., fused silica or sapphire) can be irradiated (i.e. with a focused laser beam, such as a pulsed laser with fs or ps pulse duration, scanned in the volume). Subsequently, the irradiated sample can be immersed into a solution (e.g., hydrogen fluoride (HF)) for several hours to etch the irradiated material, creating holes 620. (The etch rate selectivity between non-irradiated and irradiated spots can be as high as 1:10000.)

Figure 7:
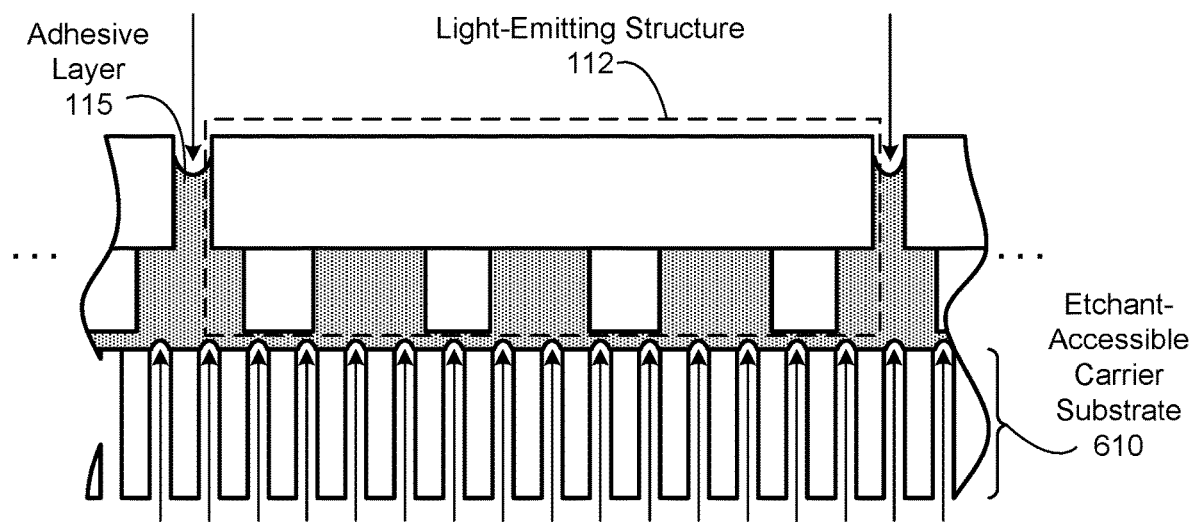
FIG. 7 is a cross-sectional view illustrating an etchant-accessible carrier substrate, according to another embodiment.

FIG. 6B is a cross-sectional view of the embodiment illustrated in FIG. 6A, at the beginning of an etching process. As can be seen, because the etchant has multiple access points 650, including additional access points beneath the etchant-accessible carrier substrate 610, the etching can remove the adhesive layer 115 much quicker than without the etchant-accessible carrier substrate 610. Moreover, as illustrated in FIG. 7, which illustrates a cross-sectional view of an embodiment of a wider light-emitting structure 112, the width of the light-emitting structure 112 does not impede the etchant from access to the adhesive layer 115 below the light-emitting structure 112. As such, usage of an etchant-accessible carrier substrate 610 as provided in the embodiments described herein enables efficient and effective etching of the adhesive layer 115 no matter the size of the light-emitting structure 112.

Figure 8:
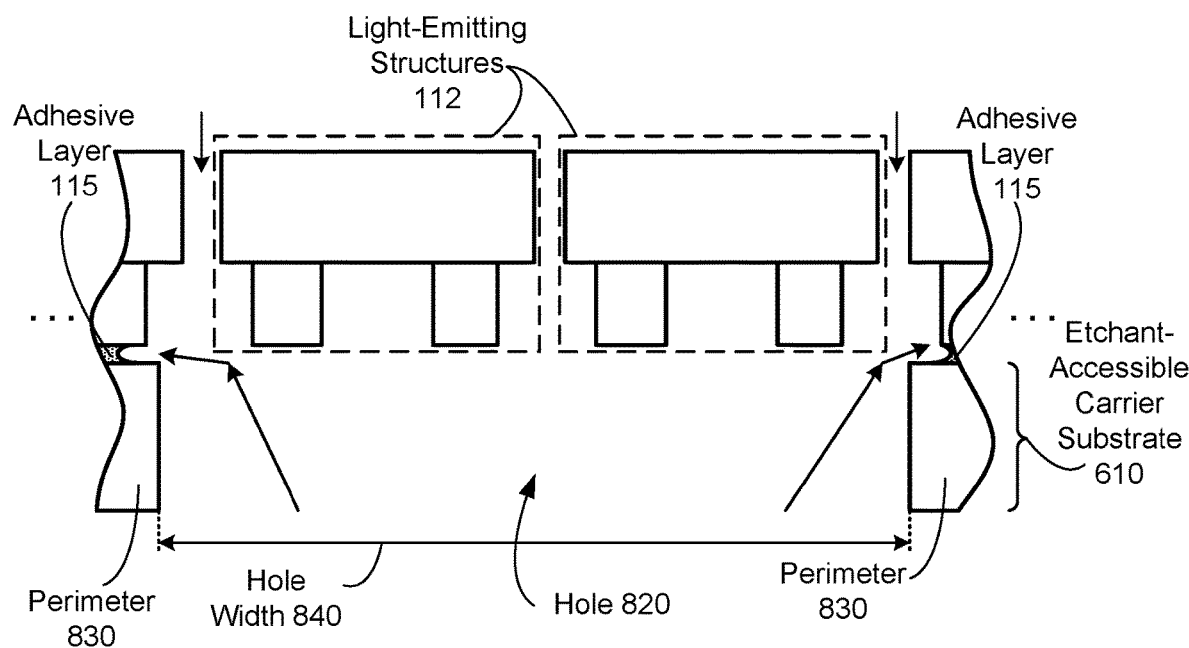
FIG. 8 is a cross-sectional view of an embodiment in which an etchant-accessible carrier substrate is open underneath.

FIG. 8 is a cross-sectional view of an alternative embodiment in which the etchant-accessible carrier substrate 610 is open underneath. That is, the etchant-accessible carrier substrate 610 has one large hole 820 through which an etchant may gain access to the adhesive layer 115. As illustrated, this embodiment any use an adhesive layer 115 with much less adhesive material, because the adhesive material may only need to be utilized on the perimeter 830 of the etchant-accessible carrier substrate 610. The hole width 840 may be wide enough to allow the light-emitting structures 112 to straddle the hole 820 without falling through.

Figure 9:
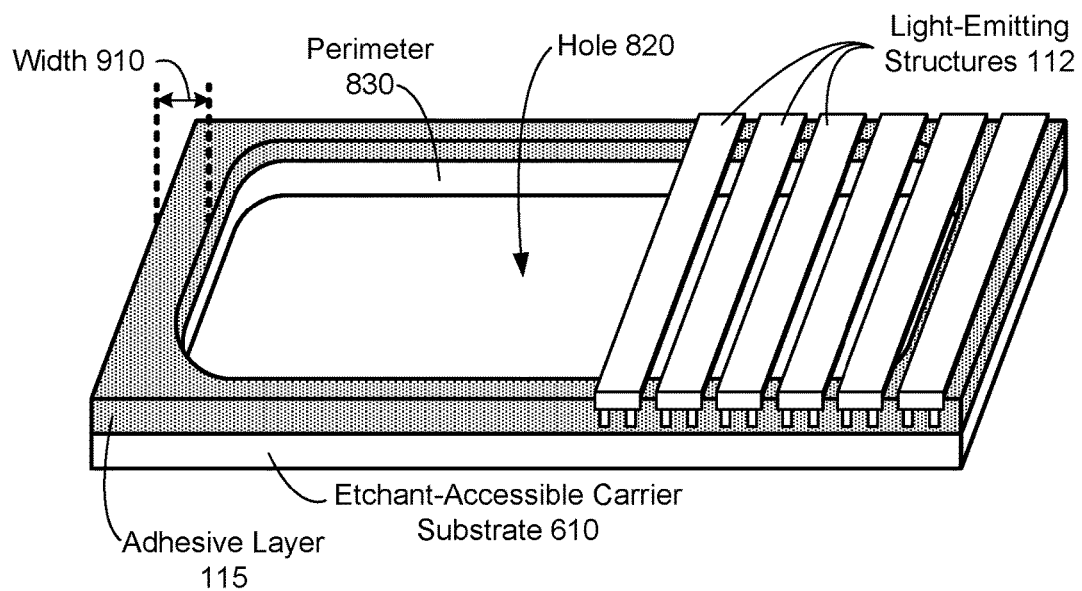
FIG. 9 is a perspective view of light-emitting structures and an adhesive layer on an etchant-accessible carrier substrate similar to FIG. 8.

FIG. 9 is a perspective view of light-emitting structures 112 and adhesive layer 115 on an etchant-accessible carrier substrate 610 similar to FIG. 8. (Here, only a portion of the light-emitting structures 112 is illustrated, to allow better visibility to the underlying adhesive layer 115 on an etchant-accessible carrier substrate 610.) As shown in FIG. 9, the light-emitting structures 112 straddle the hole 820, but are still coupled to the etchant-accessible carrier substrate 610 via the adhesive layer 115 on the perimeter 830 of the etchant-accessible carrier substrate 610. As previously mentioned, the dimensions of the hole 820 can be determined to allow the light-emitting structures 112 to straddle the hole 820 without falling through. Because of a significantly reduced amount of material in the adhesive layer 115 and the accessibility to the adhesive layer 115 by an etchant, the etching process may take a short amount of time, relative to etching processes utilizing a traditional carrier substrate (e.g. carrier substrate 114 of FIGS. 3A-3C). In some embodiments, the width 910 of the perimeter 830 may be 5 μm to 10 μm wide. Other embodiments may have a smaller or larger width 910, depending on desired functionality.

Figure 10:
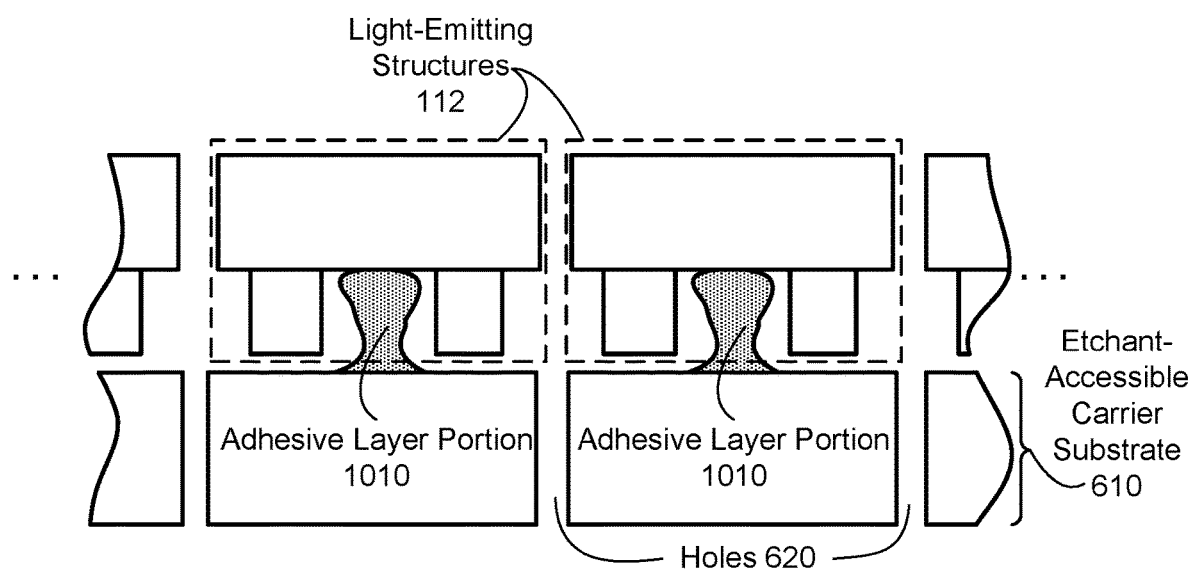
FIG. 10 is a cross-sectional view illustrating how etching may be controlled to help ensure at least a minimum threshold of adhesion of the light-emitting structures to the etchant-accessible carrier substrate, according to an embodiment.

FIG. 10 is a cross-sectional view illustrating how etching may be controlled to help ensure at least a minimum threshold of adhesion of the light-emitting structures 112 to the etchant-accessible carrier substrate 610, according to an embodiment. Because the etchant-accessible carrier substrate 610 with the light-emitting structures 112 may be moved (e.g., to a different fabrication tool) after the etching process but prior to decoupling the light-emitting structures 112 from the etchant-accessible carrier substrate 610, it may be desirable to ensure adhesive layer portions 1010 remain in contact with the light-emitting structures 112 and the etchant-accessible carrier substrate 610. This can help ensure light-emitting structures 112 stay in place, relative to the etchant-accessible carrier substrate 610, when the etchant-accessible carrier substrate 610 with the light-emitting structures 112 is moved. (The minimal adhesion that these adhesive layer portions 1010 provide may then be overcome by the pick-and-place array 104 to decouple the light-emitting structures 112 from the etchant-accessible carrier substrate 610.)

With this in mind, holes 620 may be patterned in such a way to allow accessibility to the adhesion layer 115 (in the manner described in the above embodiments) to allow additional control over the etching process. Thus, in some embodiments, the etching process may be stopped to ensure adhesive layer portions 1010 remain between the light-emitting structures 112 and the etchant-accessible carrier substrate 610. Etching to form adhesive layer portions 1010 in this manner can be utilized in embodiments having two or more rows of electrical contacts or similarly-shaped features, for example.

Figure 11:
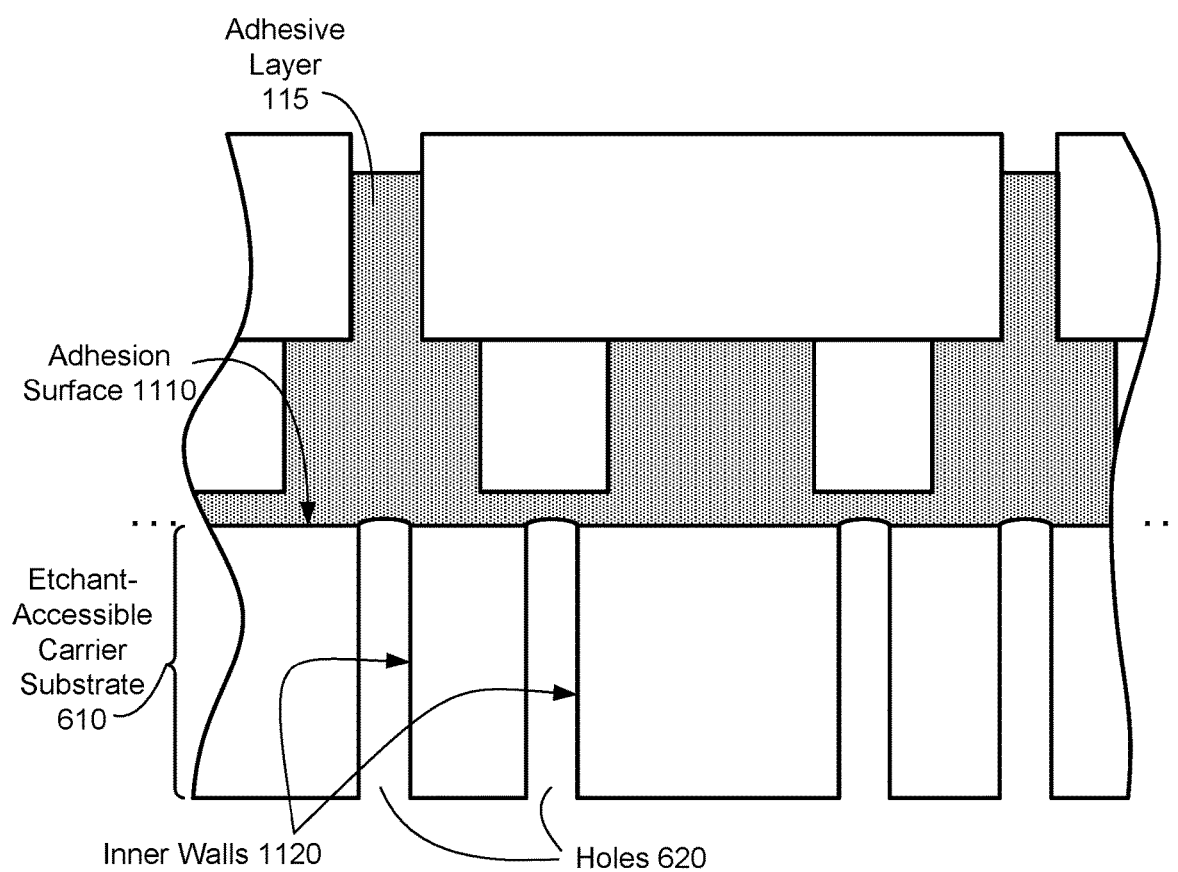
FIG. 11 is a cross-sectional view of an etchant-accessible carrier substrate, according to an embodiment, featuring hydrophobic and hydrophilic surfaces.

FIG. 11 is a cross-sectional view of an etchant-accessible carrier substrate 610, according to an embodiment, featuring hydrophobic and hydrophilic surfaces. In some embodiments, it may be desirable to make the adhesion surface 1110 of the etchant-accessible carrier substrate 610 to which the adhesive layer 115 is coupled hydrophilic. This can, for example, help ensure adhesion of the adhesive layer 115. Different methods of manufacture may be employed to cause the adhesion surface 1110 to become hydrophilic (e.g., by applying a hydrophilic substance to the adhesion surface 1110 via spin coating, by using radio frequency (RF) oxygen plasma, etc.).

Additionally or alternatively, embodiments may employ methods of making the inner walls 1120 of holes hydrophobic. Hydrophobic inner walls 1120 can help ensure the material of the adhesive layer 115 does not stick to the inner walls 1120 and potentially obstruct the holes 620, which can slow the etching process. Other factors that may be considered when determining whether the adhesive layer 115 may enter into the holes 620 are the type of adhesive layer material (e.g., type of polymer), the viscosity of the material, the size of the holes 620, the amount of pressure applied, and the like. For example, the adhesion surface 1110 can be brought in close contact with a conformable material (e.g., Polydimethylsiloxane (PDMS) thick layer) to protect the surface during an anti-stick silanization performed on the rear surface in gas phase (e.g., using fluorosilane).

Figure 12:
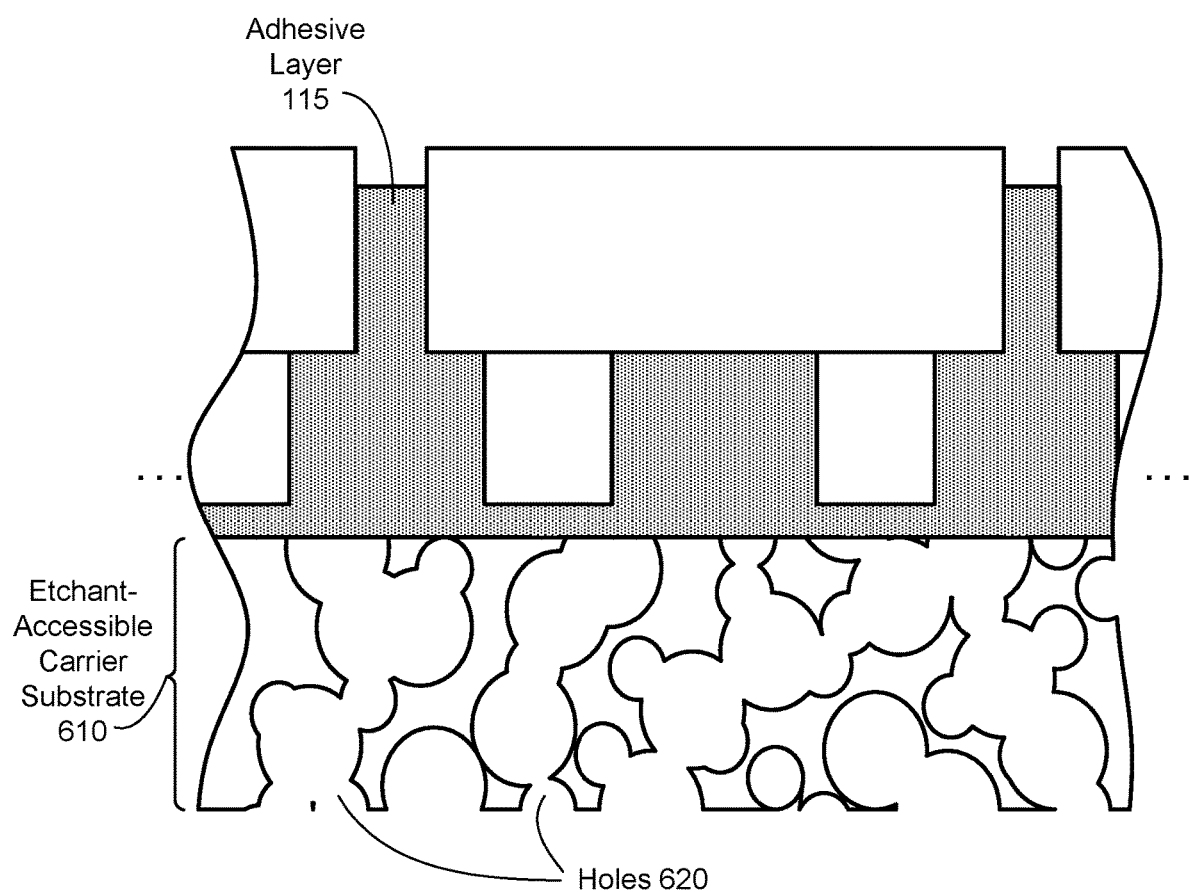
FIG. 12 is a cross-sectional view of another embodiment of an etchant-accessible carrier substrate.

FIG. 12 is a cross-sectional view of another embodiment of an etchant-accessible carrier substrate 610 provided to illustrate how the shape and structure of holes 620 may vary in alternative embodiments. Here, the etchant-accessible carrier substrate 610 is formed from a porous material forming random holes 620, which provide an etchant access to the adhesive layer 115 during an etching process. The holes 620 may be formed from any of a variety of manufacturing processes providing a porous substrate. Alternative embodiments of an etchant-accessible carrier substrate 610 may comprise holes 620 of yet other shapes and sizes.

Figure 13:
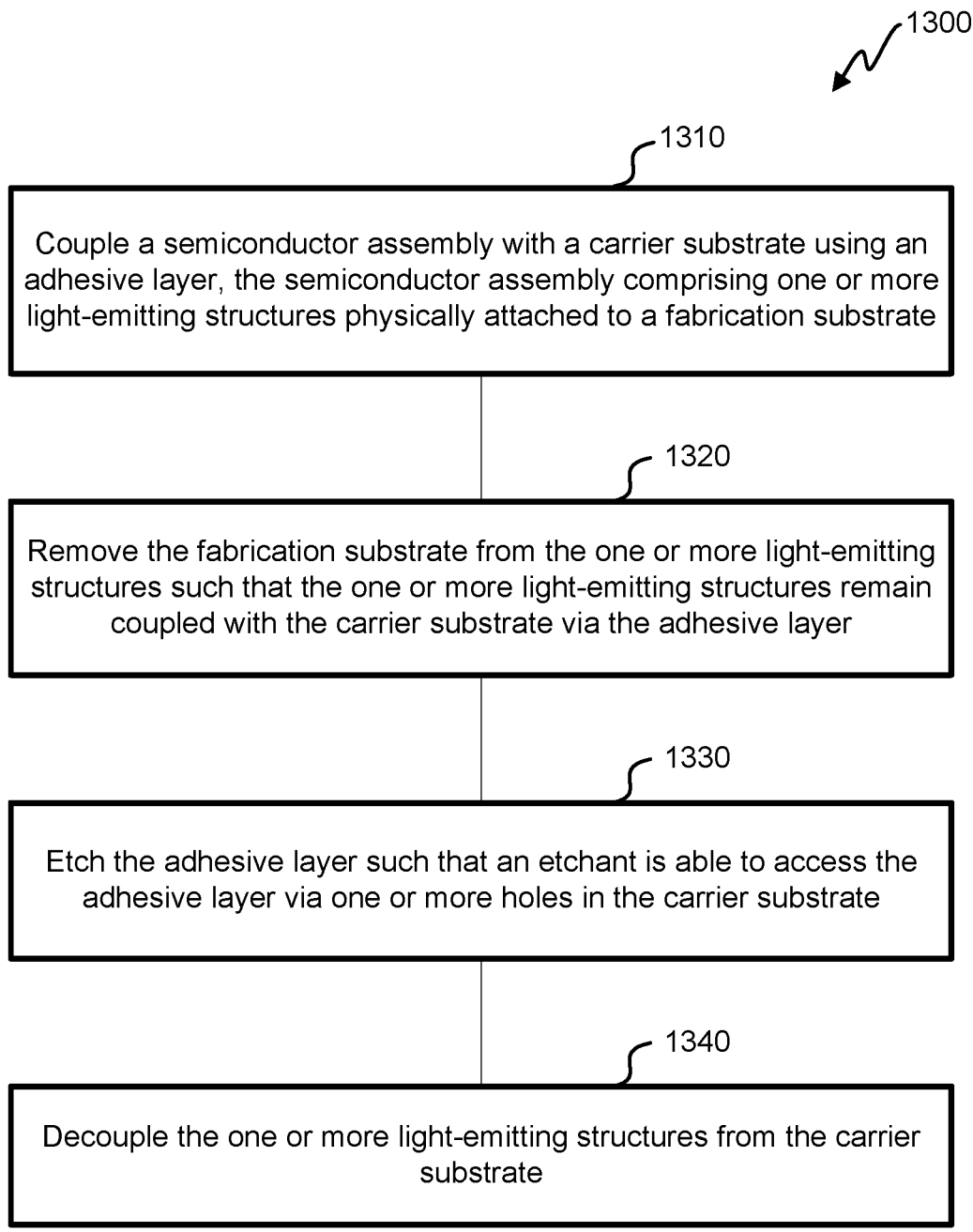
FIGS. 13 and 14 are flow diagrams of methods of manufacturing light-emitting structures, according to embodiments.

FIG. 13 is a flow diagram of a method 1300 of manufacturing light-emitting structures, according to an embodiment. It can be noted that, similar to other figures herein, FIG. 13 is provided as a non-limiting example. Alternative embodiments may add, separate, rearrange, and/or otherwise alter the functionality of the blocks illustrated in FIG. 13. A person of ordinary skill in the art will recognize such alterations. Means for performing the method may include hardware and/or software components of a computing device, including controller 106 of FIG. 1 and associated components (e.g., processor 128, memory 130, actuator(s) 122, pick-and-place head array 104, and/or etcher 126).

At block 1310, the functionality includes coupling a semiconductor assembly with a carrier substrate using an adhesive layer, where the semiconductor assembly comprises one or more light-emitting structures physically attached to a fabrication substrate. As illustrated in FIG. 3B and described above, adhesion may occur when a force is applied to the semiconductor assembly and/or carrier substrate to press the fabrication assembly at least partly into the adhesive layer. In some embodiments, the adhesive layer comprises one or more polymer layers. As noted in the embodiments described above, a diameter of each of the one or more holes in the carrier substrate may be smaller than a diameter of each metal structure of a plurality of metal structures of the one or more light-emitting structures.

Hydrophilic and/or hydrophobic properties may be utilized in some embodiments, as noted above. In some embodiments, for example, a sidewall of the one or more holes may be hydrophobic. Additionally or alternatively, a surface of the carrier substrate to which the adhesive layer coupled may be hydrophilic.

Depending on desired functionality (e.g., color of light produced by the one or more light-emitting structures), different materials may be used. In some embodiments, for example, the one or more light-emitting structures may comprise gallium nitride (GaN), gallium arsenide (GaAs), or any combination thereof. Additionally or alternatively, the fabrication substrate comprises sapphire.

As shown in FIGS. 8 and 9, in some embodiments the one or more holes comprise a single hole in the carrier substrate. In such embodiments, the single hole may extend to within a threshold distance of a perimeter of the carrier substrate. This can help ensure the perimeter has at least a minimum width to prevent light-emitting structures from falling through the hole.

In some embodiments, the one or more holes comprise a plurality of holes in the carrier substrate. The plurality of holes may comprise a random pattern of holes in the carrier substrate. Additionally or alternatively, the plurality of holes comprises a repeating pattern of holes in the carrier substrate. (In some embodiments, patterns may differ along different dimensions of the carrier substrate.) Some embodiments may include forming the plurality of holes in the carrier substrate at least in part by using a laser to etch a pattern of the plurality of holes in the carrier substrate, and using a solution to remove material from the etched pattern. Some embodiments may include, prior to coupling the semiconductor assembly with a carrier substrate, depositing the adhesive layer onto a first surface of the carrier substrate, wherein the first surface of the carrier substrate comprises the one or more holes extending from the first surface to a second surface opposite the first surface.

In some embodiments one or more light-emitting structures comprise a plurality of light-emitting structures, and each light-emitting structure of the plurality of light-emitting structures has a same number of respective holes as other light-emitting structure of the plurality of light-emitting structures through which the etchant is able to access a portion of the adhesive layer between the light-emitting structure and the carrier substrate. For example, each light-emitting structure may have two respective holes located underneath the light-emitting structure. As previously mentioned, this feature may help ensure uniformity in the etching of the adhesive layer between the light-emitting structure and the carrier substrate for all light-emitting structures.

At block 1320, the fabrication substrate is removed from the one or more light-emitting structures such that the one or more light-emitting structures remain coupled with the carrier substrate via the adhesive layer. As noted previously, an LLO process may be used, for example, where the one or more light-emitting structures comprise GaN. Removing the fabrication substrate from the one or more light-emitting structures in such embodiments may comprise illuminating an interface between the fabrication substrate and the one or more light-emitting structures with laser light, and heating the one or more light-emitting structures and fabrication substrate to at least a melting point of gallium.

In some embodiments, a subsequent cleaning process may be used. That is, after removing the fabrication substrate from the one or more light-emitting structures, the light-emitting surface of the one or more light-emitting structures may be cleaned. In some embodiments, cleaning the light-emitting surface of the one or more light-emitting structures may comprise exposing the light-emitting surface of the one or more light-emitting structures to hydrogen chloride (HCl).

At block 1330, the adhesive layer is etched such that an etchant is able to access the adhesive layer via one or more holes in the carrier substrate. As noted in the embodiments illustrated in FIGS. 6A-12, this can provide for a much faster etching process and/or enable the etchant access to portions of the adhesive layer otherwise inaccessible (e.g., due to the portions of the adhesive layer having a lateral transport distance farther than a maximum lateral transport distance enabled by the etching process).

In some embodiments, depending on desired functionality, a portion of the adhesive layer may be left to help ensure the light-emitting structures do not move relative to the carrier substrate. As previously noted, this can facilitate transport of the carrier substrate and light-emitting structures (e.g., to another fabrication tool). If such functionality is desired, the method 1300 may then further comprise stopping the etching of the adhesive layer such that at least a portion of the adhesive layer remains between at least two metal structures of at least one light-emitting structure of the one or more light-emitting structures. In some embodiments, at least a portion of the adhesive layer may be physically attached to a surface of the at least one light-emitting structure, the surface of the at least one light-emitting structure located between the at least two metal structures of the at least one light-emitting structure.

Finally, at block 1340, the one or more light-emitting structures are decoupled from the carrier substrate. As noted in FIG. 1, such decoupling can be performed by the pick-and-place array 104 to place the one or more light-emitting structures on a target substrate 118.

Figure 14:
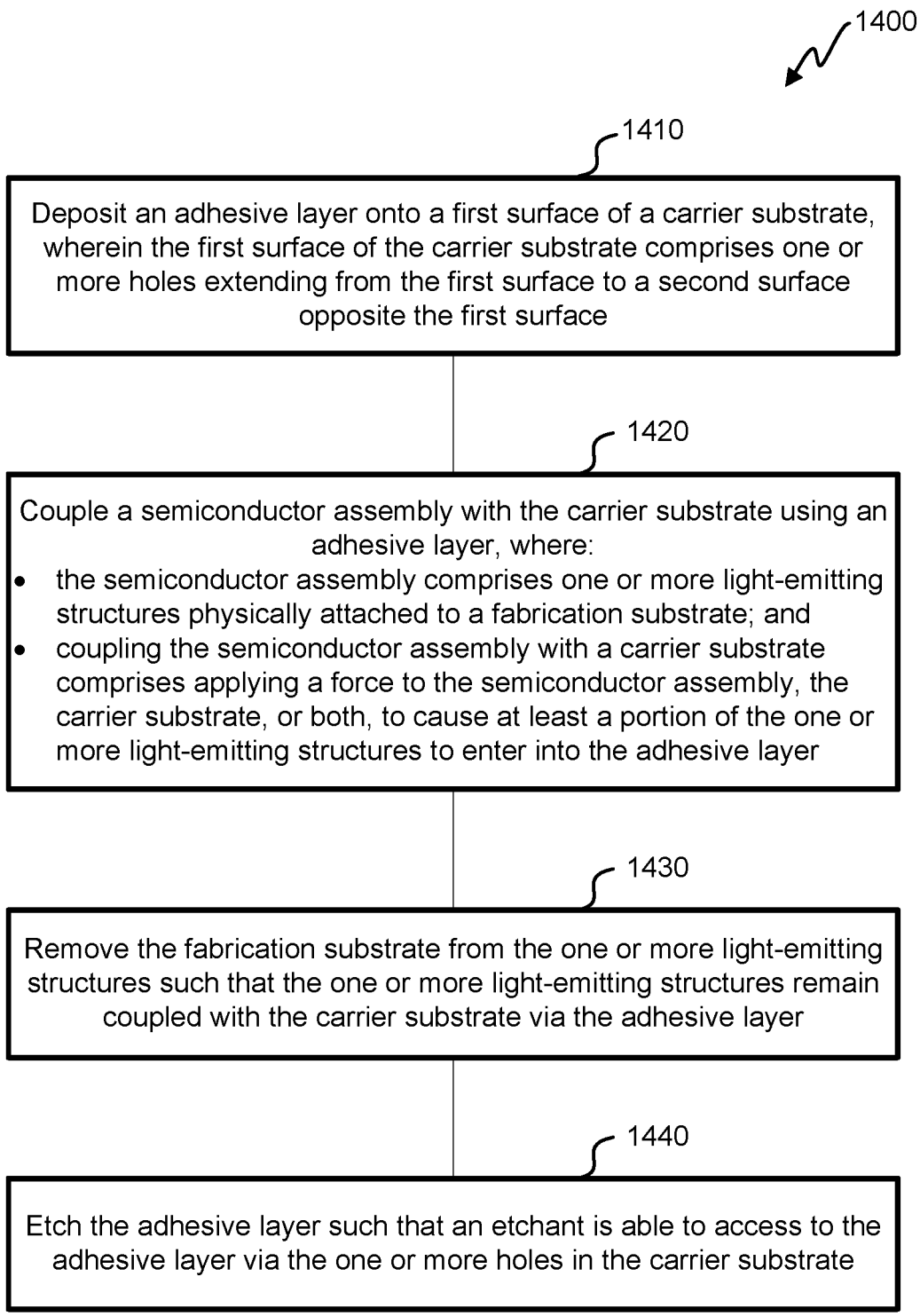

FIG. 14 is a flow diagram of a method 1400 of manufacturing light-emitting structures, according to another embodiment. Again, alternative embodiments may add, separate, rearrange, and/or otherwise alter the functionality of the blocks illustrated in FIG. 14. Means for performing the method may include hardware and/or software components of a computing device, including controller 106 of FIG. 1 and associated components (e.g., processor 128, memory 130, actuator(s) 122, pick-and-place head array 104, and/or etcher 126).

The functionality at block 1410 comprises depositing an adhesive layer onto a first surface of a carrier substrate, where the first surface of the carrier substrate comprises one or more holes extending from the first surface to a second surface opposite the first surface. Again, patterns, sizes, and/or other characteristics of the one or more holes may vary, depending on desired functionality, manufacturing concerns, and/or other factors. The method of deposition may vary, depending on the type of materials used.

At block 1420, a semiconductor assembly is coupled with the carrier substrate using an adhesive layer. Here, the semiconductor assembly comprises one or more light-emitting structures physically attached to the fabrication substrate, and coupling the semiconductor assembly with a carrier substrate comprises applying a force to the semiconductor assembly, the carrier substrate, or both, to cause at least a portion of the one or more light-emitting structures to enter into the adhesive layer. The force applied to cause the adhesion may vary, depending on the integrity of the materials used, viscosity of the adhesive layer, and/or other factors. In some embodiments, each of the one or more light-emitting structures may comprise at least one row of light-emitting elements (e.g., µLEDs) on a surface of the respective light-emitting structure.

At block 1430, the fabrication substrate is removed from the one or more light-emitting structures such that the one or more light-emitting structures remain coupled with the carrier substrate via the adhesive layer. As previously noted, the removal process may depend on the materials involved. In some embodiments, an LLO process may be used. In other embodiments, for example, a wet-etching process may be used.

At block 1440, the adhesive layer is etched such that an etchant is able to access the adhesive layer via the one or more holes in the carrier substrate. Here, etching the adhesive layer may comprise performing an isotropic etch of at least a portion of the adhesive layer, according to some embodiments. Moreover, other features described above with regard to etching may be incorporated here, depending on desired functionality. This can include, for example, stopping the etching of the adhesive layer such that at least a portion of the adhesive layer remains between at least two metal structures of at least one light-emitting structure of the one or more light-emitting structures. In some embodiments, at least a portion of the adhesive layer may be physically attached to a surface of the at least one light-emitting structure, the surface of the at least one light-emitting structure located between the at least two metal structures of the at least one light-emitting structure.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A method of manufacturing light-emitting structures, the method comprising:
   coupling a semiconductor assembly with a carrier substrate using an adhesive layer, wherein:
      the semiconductor assembly comprising one or more light-emitting structures physically attached to a fabrication substrate, and
      the carrier substrate comprises one or more holes through which at least a first portion of the adhesive layer is exposed;

removing the fabrication substrate from the one or more light-emitting structures such that:
   the one or more light-emitting structures remain coupled with the carrier substrate via the adhesive layer, and
   removing the fabrication substrate exposes at least a second portion of the adhesive layer to a subsequent etching process;
etching both the first portion and the second portion of the adhesive layer; and
decoupling the one or more light-emitting structures from the carrier substrate.

2. The method of claim 1, wherein the adhesive layer comprises one or more polymer layers.

3. The method of claim 1, wherein the one or more holes comprise a single hole in the carrier substrate, the single hole extending to within a threshold distance of a perimeter of the carrier substrate.

4. The method of claim 1, wherein the one or more holes comprise a plurality of holes in the carrier substrate, and the method further comprises forming the plurality of holes in the carrier substrate.

5. The method of claim 4, wherein forming the plurality of holes in the carrier substrate comprises:
   using a laser to etch a pattern of the plurality of holes in the carrier substrate; and
   using a solution to remove material from the etched pattern.

6. The method of claim 1, wherein the one or more holes comprise a plurality of holes forming a random pattern of holes in the carrier substrate.

7. The method of claim 1, wherein the one or more holes comprise a plurality of holes forming a repeating pattern of holes in the carrier substrate.

8. The method of claim 1, wherein:
   the one or more light-emitting structures comprise a plurality of light-emitting structures; and
   each light-emitting structure of the plurality of light-emitting structures has a same number of respective holes as other light-emitting structure of the plurality of light-emitting structures through which the etchant is able to access a portion of the adhesive layer between the light-emitting structure and the carrier substrate.

9. The method of claim 1, wherein a diameter of each of the one or more holes in the carrier substrate is smaller than a diameter of each metal structure of a plurality of metal structures of the one or more light-emitting structures.

10. The method of claim 1, wherein the one or more light-emitting structures comprise gallium nitride (GaN), gallium arsenide (GaAs), or any combination thereof.

11. The method of claim 10, wherein the one or more light-emitting structures comprise GaN and removing the fabrication substrate from the one or more light-emitting structures comprises:
   illuminating an interface between the fabrication substrate and the one or more light-emitting structures with laser light; and
   heating the one or more light-emitting structures and fabrication substrate to at least a melting point of gallium.

12. The method of claim 1, wherein a sidewall of the one or more holes is hydrophobic.

13. The method of claim 1, a surface of the carrier substrate to which the adhesive layer coupled is hydrophilic.

14. The method of claim 1, further comprising, after removing the fabrication substrate from the one or more light-emitting structures, cleaning a light-emitting surface of the one or more light-emitting structures.

15. The method of claim 14, wherein cleaning the light-emitting surface of the one or more light-emitting structures comprises exposing the light-emitting surface of the one or more light-emitting structures to hydrogen chloride (HCl).

16. The method of claim 1, wherein the fabrication substrate comprises sapphire.

17. The method of claim 1, further comprising stopping the etching of the adhesive layer such that at least a portion of the adhesive layer remains between at least two metal structures of at least one light-emitting structure of the one or more light-emitting structures.

18. The method of claim 17, wherein the at least a portion of the adhesive layer is physically attached to a surface of the at least one light-emitting structure, the surface of the at least one light-emitting structure located between the at least two metal structures of the at least one light-emitting structure.

19. The method of claim 1, further comprising:
   prior to coupling the semiconductor assembly with a carrier substrate, depositing the adhesive layer onto a first surface of the carrier substrate, wherein the first surface of the carrier substrate comprises the one or more holes extending from the first surface to a second surface opposite the first surface.

20. The method of claim 19, wherein the etching the adhesive layer comprises performing an isotropic etch of at least a portion of the adhesive layer.

21. The method of claim 19, wherein each of the one or more light-emitting structures comprises at least one row of light-emitting elements on a surface of the respective light-emitting structure.

22. A non-transitory, computer-readable medium having instructions embedded thereon for manufacturing light-emitting structures, wherein, the instructions, when executed by one or more assembly devices, cause the one or more assembly devices to:
   couple a semiconductor assembly with a carrier substrate using an adhesive layer, wherein:
      the semiconductor assembly comprising one or more light-emitting structures physically attached to a fabrication substrate, and
      the carrier substrate comprises one or more holes through which at least a first portion of the adhesive layer is exposed;
   remove the fabrication substrate from the one or more light-emitting structures such that:
      the one or more light-emitting structures remain coupled with the carrier substrate via the adhesive layer, and
      removing the fabrication substrate exposes at least a second portion of the adhesive layer to a subsequent etching process;
   etch both the first portion and the second portion of the adhesive layer; and
   decouple the one or more light-emitting structures from the carrier substrate.

23. An assembly system for of manufacturing light-emitting structures, the assembly system comprising:
   a memory; and
   a processor communicatively coupled with the memory and configured to:
      couple a semiconductor assembly with a carrier substrate using an adhesive layer, wherein:

the semiconductor assembly comprising one or more light-emitting structures physically attached to a fabrication substrate, and the carrier substrate comprises one or more holes through which at least a first portion of the adhesive layer is exposed;

remove the fabrication substrate from the one or more light-emitting structures such that:
the one or more light-emitting structures remain coupled with the carrier substrate via the adhesive layer, and
removing the fabrication substrate exposes at least a second portion of the adhesive layer to a subsequent etching process;

etch both the first portion and the second portion of the adhesive layer; and decouple the one or more light-emitting structures from the carrier substrate.

* * * * *